United States Patent
Lim et al.

(10) Patent No.: US 10,073,572 B2
(45) Date of Patent: Sep. 11, 2018

(54) CONDUCTIVE STRUCTURE AND PREPARATION METHOD THEREFOR

(71) Applicant: LG CHEM, LTD., Seoul (KR)

(72) Inventors: Jin Hyong Lim, Daejeon (KR); Song Ho Jang, Daejeon (KR); Ki-Hwan Kim, Daejeon (KR); Yong Chan Kim, Daejeon (KR); Junghwan Yoon, Daejeon (KR); Chan Hyoung Park, Daejeon (KR); Ilha Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/037,583

(22) PCT Filed: May 7, 2015

(86) PCT No.: PCT/KR2015/004530
§ 371 (c)(1),
(2) Date: May 18, 2016

(87) PCT Pub. No.: WO2015/174678
PCT Pub. Date: Nov. 19, 2015

(65) Prior Publication Data
US 2016/0299600 A1 Oct. 13, 2016

(30) Foreign Application Priority Data
May 12, 2014 (KR) ........................ 10-2014-0056765

(51) Int. Cl.
*G06F 3/044* (2006.01)
*G06F 3/041* (2006.01)
(Continued)

(52) U.S. Cl.
CPC ............ *G06F 3/044* (2013.01); *B81B 7/0006* (2013.01); *G06F 3/041* (2013.01); *G06F 3/0412* (2013.01);
(Continued)

(58) Field of Classification Search
None
See application file for complete search history.

(56) References Cited

U.S. PATENT DOCUMENTS

2007/0224730 A1 9/2007 Chang et al.
2008/0118762 A1 5/2008 Morimoto et al.
(Continued)

FOREIGN PATENT DOCUMENTS

EP 2682948 A2 1/2014
EP 2 767 985 A1 8/2014
(Continued)

OTHER PUBLICATIONS

Office Action of Korean Patent Office in Appl'n No. 10-2015-0063765, dated Sep. 19, 2016.
(Continued)

*Primary Examiner* — Kenneth B Lee, Jr.
(74) *Attorney, Agent, or Firm* — Dentons US LLP

(57) ABSTRACT

The present application relates to a conductive structure body and a method for manufacturing the same. A conductive structure body according to an exemplary embodiment of the present application includes a transparent conductive layer, a metal layer which is provided on the transparent conductive layer and includes aluminum, and an aluminum oxynitride layer which is provided on the metal layer.

14 Claims, 7 Drawing Sheets

(51) Int. Cl.
*H05K 3/00* (2006.01)
*B81B 7/00* (2006.01)

(52) U.S. Cl.
CPC ..... *H05K 3/00* (2013.01); *G06F 2203/04103* (2013.01); *H05K 2201/00* (2013.01)

(56) References Cited

U.S. PATENT DOCUMENTS

| | | |
|---|---|---|
| 2009/0104440 A1 | 4/2009 | Nashiki et al. |
| 2011/0090207 A1 | 4/2011 | Yamazaki et al. |
| 2013/0140065 A1 | 6/2013 | Koo et al. |
| 2013/0194221 A1* | 8/2013 | Takada ................ B32B 7/02 345/173 |
| 2014/0016278 A1 | 1/2014 | Hwang et al. |
| 2014/0300836 A1 | 10/2014 | Koo et al. |

FOREIGN PATENT DOCUMENTS

| | | |
|---|---|---|
| KR | 10-2006-0065473 A | 6/2006 |
| KR | 10-2008-0025367 A | 3/2008 |
| KR | 10-2009-0040850 A | 4/2009 |
| KR | 10-2011-0054369 A | 5/2011 |
| KR | 10-2012-0100758 A | 9/2012 |
| KR | 10-2012-0110065 A | 10/2012 |
| TW | 201303903 A | 1/2013 |
| WO | 2012/121519 A2 | 9/2012 |
| WO | 2014-035207 A1 | 3/2014 |

OTHER PUBLICATIONS

Office Action of Taiwanese Patent Office in Appl'n No. 104114563, dated Aug. 16, 2016.

* cited by examiner

[Figure 1A]
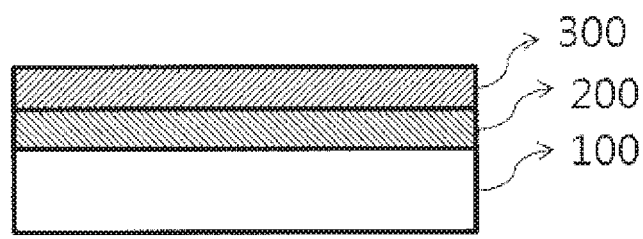
[Figure 1B]
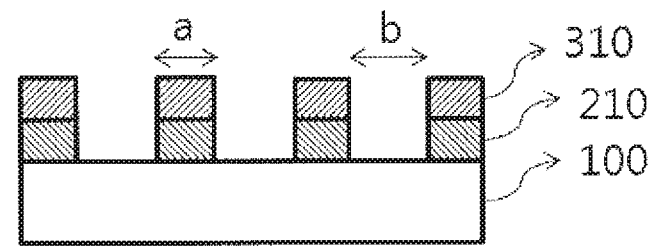

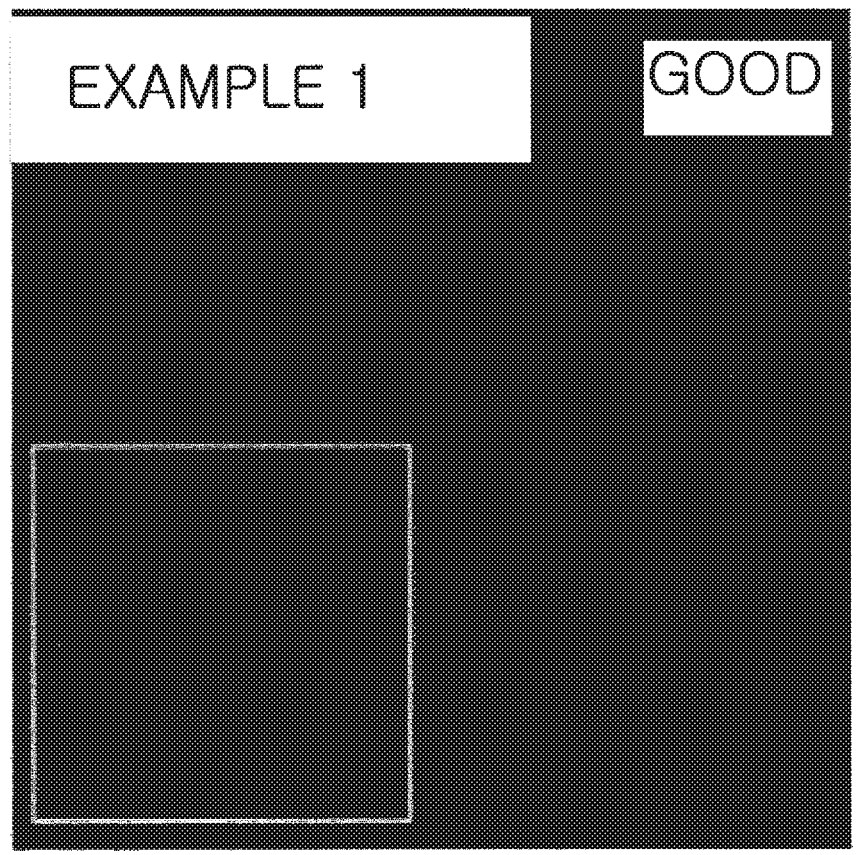

[Figure 3]
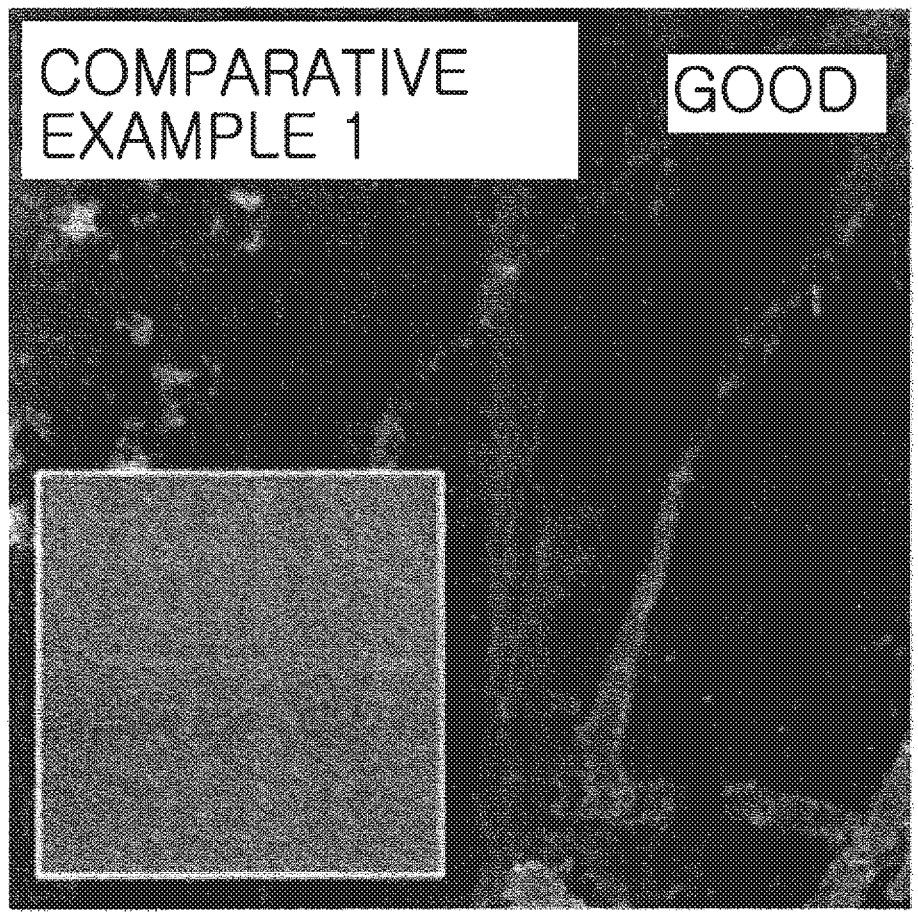

[Figure 4]
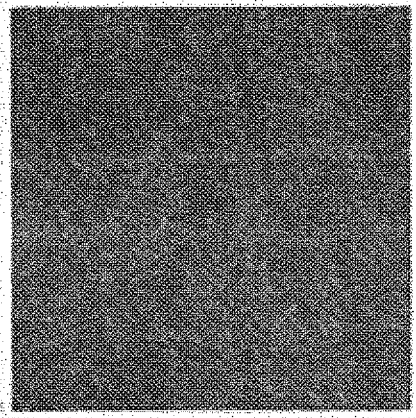

[Figure 5]
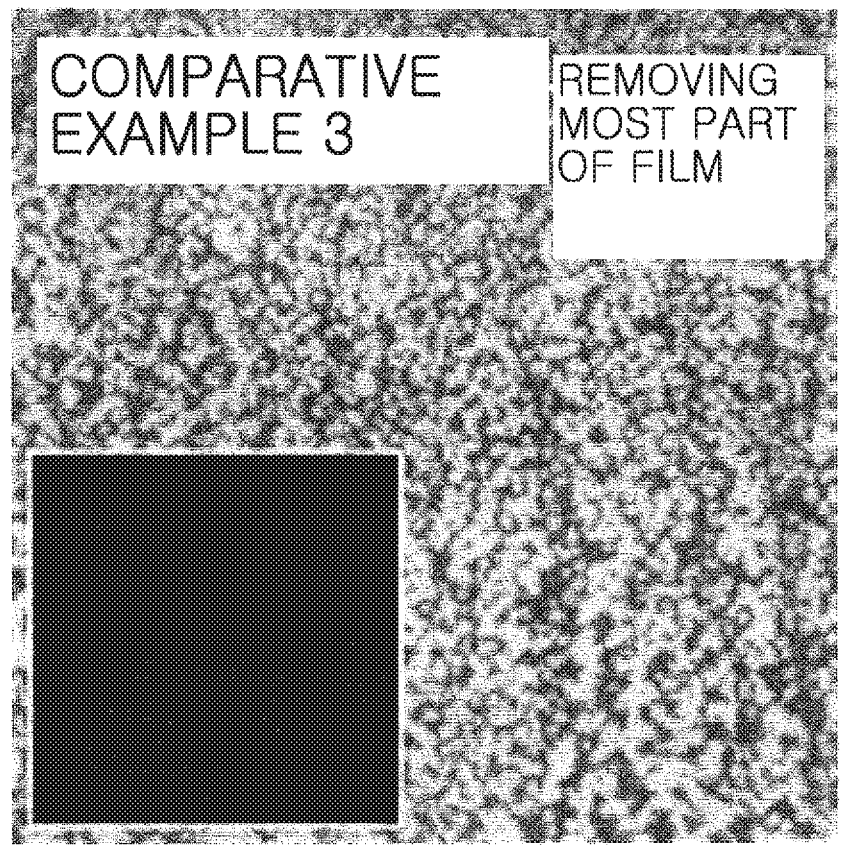

[Figure 6]
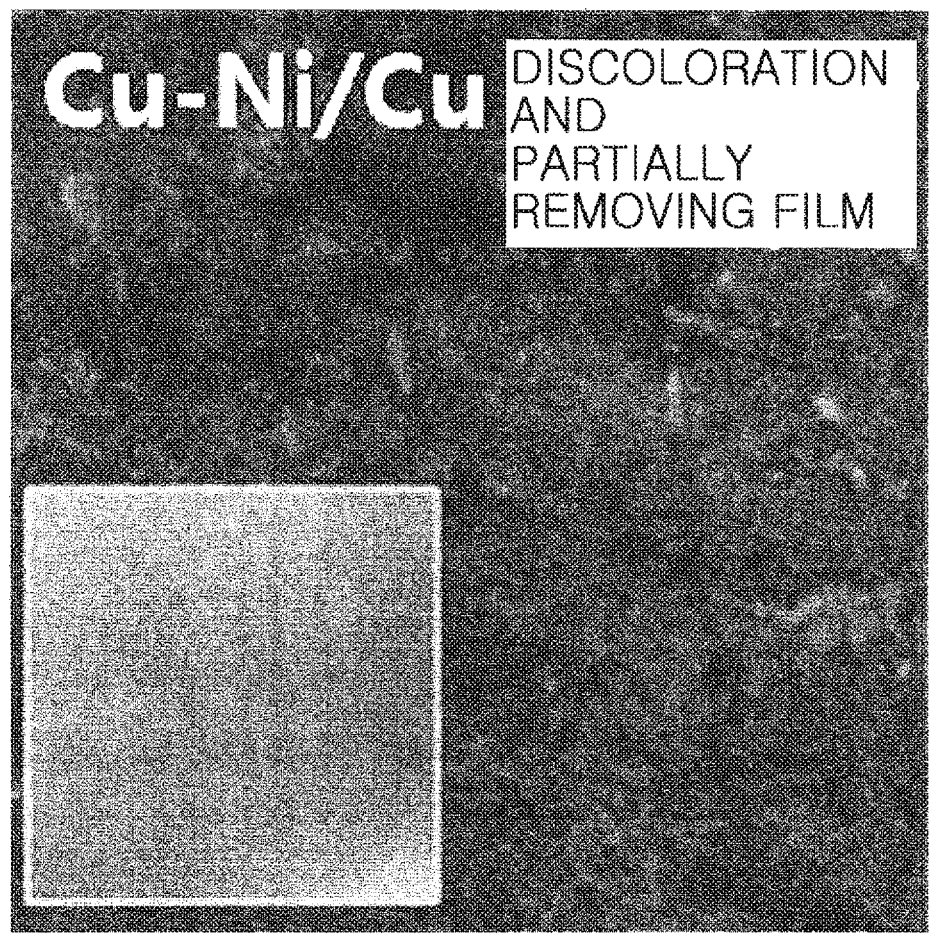

[Figure 7]
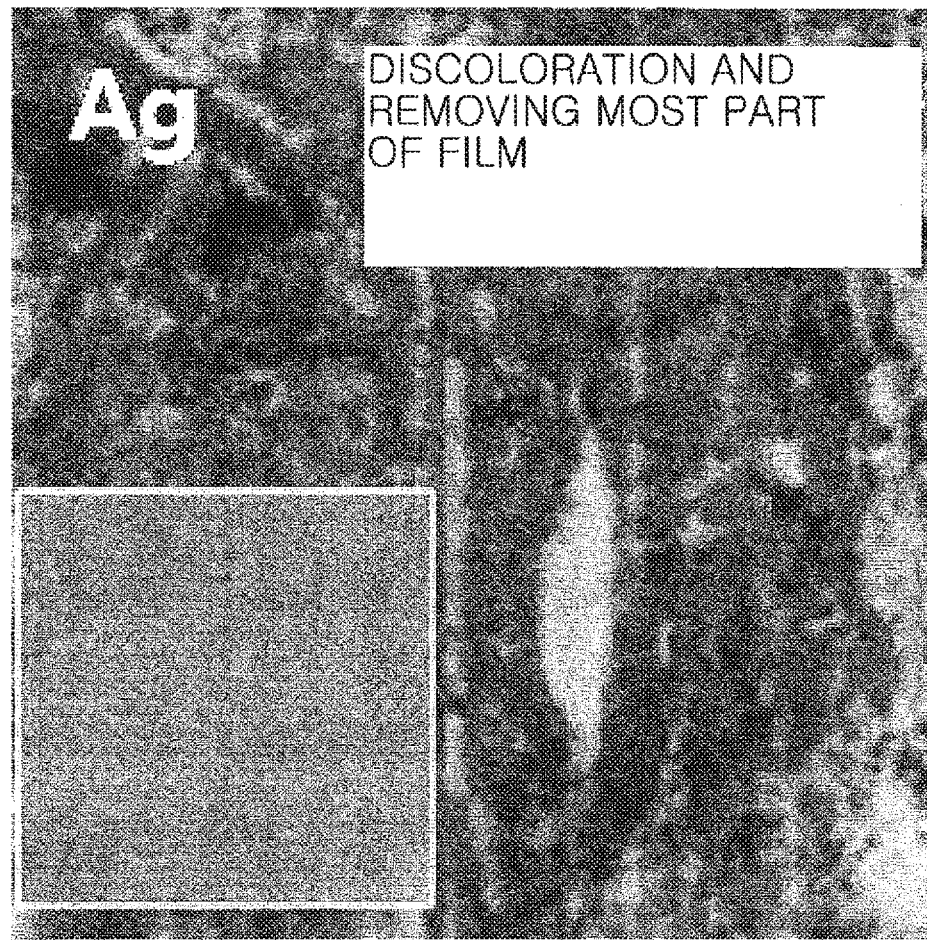

CONDUCTIVE STRUCTURE AND PREPARATION METHOD THEREFOR

TECHNICAL FIELD

This application is a National Stage Entry of International Application No. PCT/KR2015/004530, filed May 7, 2015, and claims the benefit of Korean Application No. 10-2014-0056765, filed on May 12, 2014, all of which are hereby incorporated by reference in their entirety for all purposes as if fully set forth herein.

The present application relates to a conductive structure body and a method for manufacturing the same.

BACKGROUND ART

In general, touch screen panels may be divided as follows according to a signal detecting method. That is, the touch screen panels are divided into a resistive type detecting a position pressed by pressure through a change in a current or voltage value in a state where DC voltage is applied, a capacitive type using capacitance coupling in a state where AC voltage is applied, and an electromagnetic type detecting a selected position as a change in voltage in a state where a magnetic field is applied.

Generally, in a screen portion of the touch panel, a transparent electrode is used and metal such as Ag is used as a wire electrode. Recently, as the demand of enlargement of the screen of the touch panel is increased, when the size of the touch panel is the same, a width of a bezel is relatively decreased in order to enlarge the screen. Accordingly, development of a screen portion electrode and a wire electrode which are suitable for the bezel size of a small width has been required.

RELATED ART

Patent Document

Korean Patent Publication No. 10-2011-0054369

DETAILED DESCRIPTION OF THE INVENTION

Technical Problem

In other to solve the aforementioned problems in the related art, the present specification is directed to provide a conductive structure body which is chemically and physically stable while having excellent electric conductivity and can be implemented with a minute line width.

Technical Solution

An exemplary embodiment of the present application provides a conductive structure body including: a transparent conductive layer; a metal layer provided on the transparent conductive layer and including aluminum; and an aluminum oxynitride layer provided on the metal layer.

Further, another exemplary embodiment of the present application provides a method for manufacturing the conductive structure body including: preparing a transparent conductive layer; forming a metal layer including aluminum on the transparent conductive layer; and forming an aluminum oxynitride layer on the metal layer.

Further, yet another exemplary embodiment of the present application provides a display device including the conductive structure body.

Advantageous Effects

The conductive structure body according to the exemplary embodiment of the present application includes an aluminum oxynitride layer on a metal layer including aluminum to have high salt water resistance.

The conductive structure body according to the exemplary embodiment of the present application has an advantage of being chemically and physically stable while having excellent electric conductivity.

The conductive structure body according to the exemplary embodiment of the present application has an advantage of minimizing drop in electrical conductivity of the conductive structure body according to a process environment in the case of being applied to an electrical device such as a display device.

The conductive structure body according to the exemplary embodiment of the present application has an advantage of being applied to a wire portion of a bezel area of the display device by implementing a minute line width to reduce the bezel area.

BRIEF DESCRIPTION OF DRAWINGS

FIGS. 1A and 1B are diagrams schematically illustrating a laminated structure of a conductive structure body according to an exemplary embodiment of the present application.

FIG. 2 is a diagram illustrating a photograph before and after spraying salt water (NaCl) of Example 1 as an exemplary embodiment of the present application.

FIG. 3 is a diagram illustrating a photograph before and after spraying salt water (NaCl) of Comparative Example 1 as an exemplary embodiment of the present application.

FIG. 4 is a diagram illustrating a photograph before and after spraying salt water (NaCl) of Comparative Example 2 as an exemplary embodiment of the present application.

FIG. 5 is a diagram illustrating a photograph before and after spraying salt water (NaCl) of Comparative Example 3 as an exemplary embodiment of the present application.

FIG. 6 is a diagram illustrating a photograph before and after spraying salt water (NaCl) of Comparative Example 4 as an exemplary embodiment of the present application.

FIG. 7 is a diagram illustrating a photograph before and after spraying salt water (NaCl) of Comparative Example 5 as an exemplary embodiment of the present application.

BEST MODE

In the present specification, it will be understood that when a member is referred to as being "on" another member, it can be directly on the other member or intervening them may also be present.

In the present specification, unless explicitly described to the contrary, the word "comprise" and variations such as "comprises" or "comprising", will be understood to imply the inclusion of stated elements but not the exclusion of any other elements.

Hereinafter, the present application will be described in more detail.

In the present specification, a display device, collectively referring to a TV, a computer monitor or the like, includes a display device that forms an image, and a case that supports the display device.

Examples of the display device may include a plasma display panel (PDP), a liquid crystal display (LCD), an electrophoretic display, a cathode-ray tube (CRT), an OLED display, and the like. The display device may include an RGB pixel pattern for implementing an image and an additional optical filter.

Meanwhile, with respect to the display device, as distribution of smart phones, tablet PCs, IPTVs, and the like has been accelerated, requirement for a touch function in which a hand of human directly becomes an input device without requiring a separate input device such as a keyboard or a remote controller has gradually increased. Further, a writable multi-touch function has been required in addition to a specific point touch function.

Currently, most of commercially available touch screen panels (TSP) are based on a transparent conductive ITO thin film, but have problems in that a touch recognition speed is decreased because of a RC delay due to relatively high surface resistance of the ITO transparent electrode when a touch screen panel having a large area is applied (minimum 150 Ω/sq, ELECRYSTA products manufactured by Nitto Denko Co., Ltd.), and an additional compensation chip for overcoming the decrease needs to be introduced. Further, currently, when manufacturing a touch screen panel, an ITO transparent electrode has been frequently used. Generally, in the case of the screen portion of the touch screen panel, the ITO transparent electrode is used, and in the case of the wire portion, metal such as Ag and Cu having relatively small resistance is used. However, recently, while the demand on a narrow bezel is increased, the demand on a metal deposition film on ITO has been increased.

The narrow bezel is related with a trend in which a touch screen can be enlarged in a limited size of a mobile device, and as the number of channels is increased according to a high-resolution trend of the screen, a width of the metal wire is gradually decreased.

In the related method, a wire having 100 μm/100 μm (line width/line distance) has been used by screen-printing an Ag paste, but in order to implement a wire having 30 μm/30 μm (line width/line distance) according to the demand of the narrow bezel, an exposure etching method needs to be applied. In this case, a minute line width is implemented by depositing a wire metal on an ITO film, dry film resist (DFR)-laminating the deposited wire metal, and then exposing and etching the pattern.

As the metal for deposition, Ag, Cu, Al, and the like having excellent conductivity have been frequently used, but particularly, since Cu is vulnerable to oxidation and corrosion, the Cu has a structure having two or more layers by laminating an Ni alloy (Cu—Ni, Ni—Cr, or the like) serving as an oxidation and corrosion preventing layer.

In this regard, high reliability against high-temperature and humidity and salt water spraying with respect to the touch screen panel has been required, and since most of metals have weak salt water resistance, it is important to improve the salt water resistance.

Further, as a main material of the electrode used in the existing product, an Ag-based material, a Cu-based material, or the like has been used. However, in the case of the Ag-based material, in order to overcome weak adhesion with ITO, a Mo seed layer is used, and in the case of the Cu-based material, in order to improve weak corrosion resistance, a Ni alloy is used. However, these materials basically have an extremely weak characteristic to the salt water resistance.

As a result, the present application intends to implement an electrode structure using an Al-based material which is relatively strong to oxidation and salt water spraying and improve durability and salt water resistance for the high-temperature and humidity.

A conductive structure body of an exemplary embodiment of the present application includes a transparent conductive layer, a metal layer which is provided on the transparent conductive layer and includes aluminum, and an aluminum oxynitride layer which is provided on the metal layer.

FIG. 1A illustrates a laminated structure of the conductive structure body according to an exemplary embodiment of the present specification. In detail, in FIG. 1A, in the conductive structure body, a metal layer 200 and an aluminum oxynitride layer 300 are sequentially provided on a transparent conductive layer 100. However, the conductive structure body is not limited to the structure of FIG. 1A and may further include an additional layer.

In the present application, when considering flexible printed circuit board (FPCB) bonding, an etching process, and the like, in the case where the layer provided on the metal layer is the aluminum oxynitride layer, excellent connection resistance may be achieved.

In the present application, the aluminum oxynitride layer includes aluminum oxynitride represented by AlOxNy, x may be more than 0 and 1.5 or less, y may be 0.1 or more and 1 or less, x may be a content ratio of oxygen atoms in aluminum oxynitride, and y may be a content ratio of nitrogen atoms in aluminum oxynitride.

In the present application, x of the aluminum oxynitride may be 0.01 or more. In detail, when the content ratio of oxygen atoms in aluminum oxynitride is more than 0 or 0.01 or more, corrosion resistance of the conductive structure body may be significantly improved.

In the present application, the aluminum oxynitride layer may include the aluminum oxynitride represented by AlOxNy as a main component.

The aluminum oxynitride layer may prevent physical damage or chemical damage to the metal layer. In detail, the aluminum oxynitride layer is provided at an outermost side of the conductive structure body to prevent deterioration of electrical conductivity of the conductive structure body by preventing corrosion of the metal layer.

When the conductive structure body is applied to an electrical device such as a display device, the conductive structure body may be exposed to a high-temperature and humidity process environment, and in such an environment, the aluminum oxynitride layer has an advantage of effectively preventing deterioration of performance of the conductive structure body.

In the present application, a thickness of the aluminum oxynitride layer may be 10 nm or more and 100 nm or less. In detail, in the present application, the thickness of the aluminum oxynitride layer may be 20 nm or more and 60 nm or less, but is not limited thereto.

In the present application, when the thickness of the aluminum oxynitride layer is within the range, an effect of preventing corrosion of the metal layer is excellent and patterning with uniform line width and thickness is easy. When the thickness of the aluminum oxynitride layer is less than 10 nm, there is a problem in that physical and chemical damage to the metal layer is not sufficiently prevented. Further, when the thickness of the aluminum oxynitride layer is more than 100 nm, there is a problem in that it is difficult to pattern the aluminum oxynitride layer.

In the present application, at a high-temperature and humidity atmosphere of 85° C. and relative humidity of 85%, after 210 hours, a rate of increase in surface resistance of the conductive structure body may be 1% or less.

The high-temperature and humidity atmosphere is to measure durability to moisture of the conductive structure body, and at the high-temperature and humidity atmosphere, changing a rate of increase in surface resistance of the aluminum oxynitride layer beyond 1% may mean that a property of the aluminum oxynitride layer is largely changed and as a result, the corrosion of the metal layer may not be effectively prevented.

In the present application, the metal layer may be provided to physically contact the aluminum oxynitride layer. In detail, when the metal layer physically contacts the aluminum oxynitride layer, at a high-temperature environment, the aluminum oxynitride layer prevents the metal layer from being oxidized to maintain excellent electrical conductivity of the metal layer.

According to the exemplary embodiment of the present specification, the conductive structure body may further include a substrate. In detail, according to the exemplary embodiment of the present specification, the transparent conductive layer may be provided on the substrate.

According to the exemplary embodiment of the present specification, a transparent conductive oxide layer may be used as the transparent conductive layer. As the transparent conductive oxide, indium oxide, zinc oxide, indium tin oxide, indium zinc oxide, indium zinc tin oxide, an amorphous transparent conductive polymer, and the like may be used, and one kind or two or kinds thereof may be used together, and the transparent conductive oxide is not limited thereto. According to the exemplary embodiment of the present specification, the transparent conductive layer may be an indium tin oxide layer.

The "transparency" of the present specification means that transmittance of visible light is 70% or more or 80% or more.

The thickness of the transparent conductive layer may be 15 nm or more and 20 nm or less, but is not limited thereto.

The transparent conductive layer may be formed by using a deposition process or a printing process on the substrate by using the aforementioned material for the transparent conductive layer. The substrate is not particularly limited and may use a material which is known in the art. For example, the substrate may adopt glass, a plastic substrate, a plastic film, and the like, but the substrate is not limited thereto.

According to the exemplary embodiment of the present specification, the substrate is not particularly limited and may use a material which is known in the art. According to the exemplary embodiment of the present specification, the substrate may be any one of transparent substrates, and for example, the substrate may be glass, polyethylene terephthalate (PET), polycarbonate (PC), or polyamide (PA).

In the present application, the metal layer including aluminum may be formed by using a known method in the art. For example, the metal layer may be formed by a method such as deposition, sputtering, wet coating, evaporation, electrolytic plating or electroless plating, lamination of a metal foil, or the like.

Further, the metal layer may also be formed by a printing method. In the case where the metal layer is formed by a printing method, ink or paste including metal may be used, and the paste may further include a binder resin, a solvent, a glass frit, and the like in addition to the metal.

The thickness of the metal layer is not particularly limited, but the metal layer having the thickness of 0.01 μm or more and 30 μm or less may have greater effect in terms of conductivity of the metal layer and economics of a pattern forming process. By considering a specific resistance value of the metal configuring the metal layer, a surface resistance value of the metal layer may be 0.1 to 100 Ω/sq, and the thickness of the metal layer may be adjusted so as to have such a surface resistance value.

The aluminum oxynitride layer may be formed by using a method known in the art. For example, the aluminum oxynitride layer may be formed by a method such as deposition, sputtering, wet coating, evaporation, electrolytic plating or electroless plating, and lamination of a metal foil.

Further, the aluminum oxynitride layer may also be formed by a printing method. When the aluminum oxynitride layer is formed by a printing method, ink or paste including aluminum oxide, aluminum nitride, or aluminum oxynitride may be used, and the paste may further include a binder resin, a solvent, a glass frit, and the like in addition to aluminum oxide, aluminum nitride, or aluminum oxynitride.

In the present application, the metal layer and the aluminum oxynitride layer may be patterned.

According to the exemplary embodiment of the present specification, the metal layer may be a metal pattern layer including one or more conductive lines. In detail, the metal pattern layer may be the patterned metal layer.

According to the exemplary embodiment of the present specification, the aluminum oxynitride layer may be provided on at least one surface of the conductive line. In detail, according to the exemplary embodiment of the present specification, when the metal layer is the metal pattern layer, the aluminum oxynitride layer may be provided on the conductive line of the metal pattern layer. In more detail, according to the exemplary embodiment of the present specification, the aluminum oxynitride layer may be an aluminum oxynitride pattern layer provided on the metal pattern layer.

According to the exemplary embodiment of the present specification, the metal pattern layer and the aluminum oxynitride pattern layer may form regular patterns or irregular patterns. In detail, the metal pattern layer and the aluminum oxynitride pattern layer may be provided by forming patterns on the transparent conductive layer through a patterning process.

In detail, the pattern may be a polygon such as a triangle and a quadrangle, a circle, an oval, or an amorphous shape. The triangle may be an equilateral triangle, a right triangle, or the like, and the quadrangle may be a square, a rectangle, a trapezoid, or the like.

As the regular pattern, a pattern shape in the art such as a mesh pattern may be used. The irregular pattern is not particularly limited, but may also be a boundary line shape of figures forming a Voronoi diagram. In the present application, in the case of using the irregular pattern, a diffraction pattern of reflective light due to directional illumination may be removed by the irregular pattern, and an effect by scattering of light may be minimized by the metal nitride pattern layer, thereby minimizing a problem on visibility.

According to the exemplary embodiment of the present specification, the aluminum oxynitride layer may be provided on an opposite surface to a surface where the conductive line is adjacent to the transparent conductive layer.

FIG. 1B illustrates a laminated structure in the case of patterning the conductive structure body according to the exemplary embodiment of the present specification. In detail, in FIG. 1B, the conductive structure body includes a metal layer 210 and an aluminum oxynitride layer 310 which are sequentially patterned on a transparent conductive layer 100. However, the conductive structure body is not limited to the structure of FIG. 1B and may further include an additional layer.

In FIG. 1B, a means a line width of the pattern layer, and b means a line distance between adjacent conductive lines of the pattern layer.

According to the exemplary embodiment of the present specification, the line width of the metal pattern layer may be 0.1 μm or more and 100 μm or less. In detail, according to the exemplary embodiment of the present specification, the line width of the metal pattern layer may be 0.1 μm or more and 50 μm or less and 0.1 μm or more and 30 μm or less, but is not limited thereto. The line width of the metal pattern layer may be designed according to a final usage of the conductive structure body.

When the line width is less than 0.1 μm, it is difficult to implement the pattern, and when the line width is more than 100 μm, it is difficult to apply the pattern to a narrow bezel portion. When the line width is 30 μm or less, the number of channels may be increased in the narrow bezel portion, and as a result, it is advantageous in enlargement and high-resolution of the screen.

According to the exemplary embodiment of the present specification, the line width of the metal pattern layer may be 80% to 120% with respect to the line width of the aluminum oxynitride pattern layer. When the line width of the aluminum oxynitride pattern layer is equal to or larger than the line width of the metal pattern layer, the effect of preventing oxidation and corrosion of the metal pattern layer may be increased.

According to the exemplary embodiment of the present specification, the line distance between adjacent conductive lines of the metal pattern layer may be 0.1 μm or more and 100 μm or less. According to the exemplary embodiment of the present specification, the line distance may be 0.1 μm or more, more particularly 10 μm or more, and much more particularly 20 μm or more. Further, according to the exemplary embodiment of the present specification, the line distance may be 100 μm or less and more particularly 30 μm or less.

According to the exemplary embodiment of the present specification, since the metal pattern layer and the aluminum oxynitride pattern layer may be implemented by the patterns with a minute line width, there is an advantage of implementing more channels in the narrow bezel area.

That is, in the present application, the metal layer including aluminum is formed on the transparent conductive layer, the metal pattern is formed by patterning the metal layer, and then the aluminum oxynitride layer may be formed on the metal pattern. Further, in the present application, the metal layer including aluminum is formed on the transparent conductive layer, the aluminum oxynitride layer is formed on the metal layer, and then the metal layer and the aluminum oxynitride layer are simultaneously patterned to form the patterned metal layer and the patterned aluminum oxynitride layer.

According to the exemplary embodiment of the present specification, an additional metal layer may be further included between the transparent conductive layer and the metal layer.

According to the exemplary embodiment of the present specification, the additional metal layer may include two or more metals selected from a group consisting of copper, aluminum, neodymium, molybdenum, titanium, and nickel. In detail, the additional metal layer may include Cu—Ni.

The additional metal layer may serve to minimize deterioration of electrical conductivity of the conductive structure body and improve adhesion between the transparent conductive layer and the metal layer.

An example of the conductive structure body according to an exemplary embodiment of the present application is exemplified in FIG. 1A below. FIG. 1A is to exemplify a laminated sequence of the transparent conductive layer, the metal layer, and the aluminum oxynitride layer, and the metal layer and the aluminum oxynitride layer may have patterned shapes rather than the entire layer when being actually applied for a bezel electrode of the touch screen panel and the like.

In the exemplary embodiment of the present application, the surface resistance of the conductive structure body may be 0.1 Ω/sq or more and 300 Ω/sq or less, particularly 0.1 Ω/sq or more and 100 Ω/sq or less, more particularly 0.1 Ω/sq or more and 50 Ω/sq or less, and much more particularly 0.1 Ω/sq or more and 20 Ω/sq or less. Further, according to the exemplary embodiment of the present specification, the surface resistance of the conductive structure body may be 0.1 Ω/sq or more and 1 Ω/sq or less. In detail, according to the exemplary embodiment of the present specification, the surface resistance of the conductive structure body may be 0.1 Ω/sq or more and 0.5 Ω/sq or less.

If the surface resistance of the conductive structure body is 0.1 Ω/sq or more and 300 Ω/sq or less, there is an effect of replacing an ITO transparent electrode in the related art. When the surface resistance of the conductive structure body is from 0.1 Ω/sq or more and 100 Ω/sq or less or 0.1 Ω/sq and 50 Ω/sq, particularly, 0.1 Ω/sq or more and 20 Ω/sq or less, the surface resistance is significantly lowered as compared with when the ITO transparent electrode in the related art is used, and thus there are advantages in that when a signal is applied, the RC delay becomes shorter, the touch recognition speed may be significantly improved, and as a result, a touch screen having a large area of 10 inches or more is easily applied.

According to the exemplary embodiment of the present specification, the conductive structure body may be applied to a touch panel sensor, a conductive line of the wire portion applied to the bezel portion of the display device, or the like. Recently, since a touch sensor module tends to be enlarged and the width of the bezel portion tends to be decreased, a minuter conductive pattern layer having higher electrical conductivity is required. Therefore, when the surface resistance of the conductive structure body satisfies the range, in the case of applying the conductive film to a device, an excellent effect may be exerted.

Further, a method for manufacturing the conductive structure body according to the exemplary embodiment of the present application includes: preparing a transparent conductive layer;

forming a metal layer including aluminum on the transparent conductive layer; and forming an aluminum oxynitride layer on the metal layer.

In the present application, since the contents of the transparent conductive layer, the metal layer, and the aluminum oxynitride layer are the same as those described above, the detailed description thereof will be omitted.

In the present application, the method may further include individually or simultaneously patterning the metal layer, the aluminum oxide layer, and the aluminum oxynitride layer.

A method of patterning the metal layer and the aluminum oxynitride layer may use a method known in the art and is not particularly limited. For example, in order to pattern the metal layer, a photoresist method may be used. In detail, the method may use a method of forming a photoresist pattern on the metal layer by selective exposure and development or forming a resist pattern by a printing method, and selectively etching a metal layer which is not coated with the resist pattern by using the resist pattern as a mask.

The method for manufacturing according to the exemplary embodiment of the present specification may further include simultaneously patterning the metal layer and the aluminum oxynitride layer.

In the method for manufacturing according to the exemplary embodiment of the present specification, the simultaneously patterning may be integrally etching using an etchant.

In the method for manufacturing according to the exemplary embodiment of the present specification, since the metal layer and the aluminum oxynitride layer may be etched by using an aluminum etchant, it is advantageous in that the metal layer and the aluminum oxynitride layer may be integrally etched.

The exemplary embodiment of the present specification provides an electronic device including the conductive structure body. According to the exemplary embodiment of the present specification, the electronic device may be a touch panel, light emission glass, a light emission element, a solar cell, or a transistor.

The touch panel, the light emission glass, the light emission element, the solar cell, and the transistor may be those which are generally known in the art, and the electrode may be used as the transparent electrode of the present specification.

Yet another exemplary embodiment of the present specification provides a display device including the conductive structure body.

According to the exemplary embodiment of the present specification, the conductive structure body may be a wire portion of the bezel area.

In the present specification, the display device, collectively referring to a TV, a computer monitor or the like, includes a display device that forms an image, and a case that supports the display device.

Yet another exemplary embodiment of the present application provides a touch screen panel including the conductive structure body. For example, in a capacitive touch screen panel, the conductive structure body according to the exemplary embodiment of the present application may be used as a touch-sensitive electrode substrate. Particularly, the conductive structure body is more preferably applied to the wire portion such as a bezel electrode in the touch screen panel, but is not limited thereto.

The touch screen panel including according to the exemplary embodiment of the present application may further include an additional structure body other than the aforementioned conductive structure body. In this case, two structure bodies may be disposed in the same direction, or may be disposed in directions opposite to each other. When two or more structure bodies are included, an insulation layer may be provided therebetween. In this case, the insulating layer may additionally have a function as an adhesive layer.

The touch screen panel according to the exemplary embodiment of the present application may include a lower substrate; an upper substrate; and an electrode layer provided on any one surface or both surfaces of a surface of the lower substrate contacting the upper substrate and a surface of the upper substrate contacting the lower substrate. The electrode layers may perform a function for detecting an X-axial position and a Y-axial position, respectively.

In this case, one or both of the electrode layer provided on the lower substrate and the surface of the lower substrate contacting the upper substrate; and the electrode layer provided on the upper substrate and the surface of the upper substrate contacting the lower substrate may be the conductive structure body according to the aforementioned exemplary embodiment of the present application.

In the case where the electrode layers are provided on sides of both the upper substrate and the lower substrate to form a two-layered electrode layer, an insulating layer or a spacer may be provided between the lower substrate and the upper substrate so that a distance between the electrode layers is uniformly maintained and the electrode layers are not connected to each other. The insulating layer may include an adhesive or a UV or thermosetting resin. The touch screen panel may further include a ground portion connected to the pattern of the conductive layer in the aforementioned conductive structure body. For example, the ground portion may be formed at an edge of the surface with the pattern of the conductive layer of the substrate. Further, at least one of an anti-reflective film, a polarization film, and an anti-fingerprinting film may be provided on at least one surface of a laminate including the conductive structure body. According to a design specification, different kinds of functional films in addition to the aforementioned functional films may further be included. As described above, the touch screen panel may be applied to display devices such as an OLED display panel, a liquid crystal display (LCD), a cathode-ray tube (CRT), and a PDP.

Hereinafter, the present invention will be described in more detail with reference to Examples, Comparative Examples, and Experimental Examples. However, Examples, Comparative Examples and Experimental Examples below are to just exemplify the present invention and the scope of the present invention is not limited to the following Examples, Comparative Examples, and Experimental Examples.

EXAMPLES

Example 1

A conductive structure body was manufactured by forming an Al layer having a thickness of 80 nm with a metal layer by a DC sputtering method using an Al single target on a crystalline ITO substrate and forming an aluminum oxynitride layer including $AlO_xN_y$ ($0<x<1.5$, $0.1 \leq y<1$) having a thickness of 50 nm by injecting $N_2$ reactive gas while depositing an Al metal target by the DC sputtering method.

Comparative Example 1

A conductive structure body was manufactured by forming an Al layer having a thickness of 80 nm with a metal layer by a direct current sputtering (DC sputtering) method using an Al single target on a crystalline ITO substrate.

Comparative Example 2

A conductive structure body was manufactured by forming a Cu layer having a thickness of 60 nm with a metal layer by a DC sputtering method using a Cu single target on a crystalline ITO substrate.

Comparative Example 3

A conductive structure body was manufactured by forming a Cu layer having a thickness of 60 nm with a metal layer by a DC sputtering method using a Cu single target on a crystalline ITO substrate and forming a darkening layer including CuOx (0<x≤1) having a thickness of 35 nm by injecting O₂ reactive gas while depositing a Cu metal target by the DC sputtering method.

Comparative Example 4

A Cu layer having a thickness of 150 nm was formed with a metal layer by a DC sputtering method using a Cu single target on a crystalline ITO substrate and then a layer of 30 nm was additionally formed with a target of Cu—Ni (55:45 wt %) by the DC sputtering method.

Comparative Example 5

A Mo seed layer having a thickness of 15 nm was formed with a metal layer by a DC sputtering method using an Mo single target on a crystalline ITO substrate and then a layer of 100 nm was additionally formed with a target of Ag by the DC sputtering method.

Experimental Example 1

A rate of increase in surface resistance of the conductive structure body was evaluated after maintaining the conductive structure bodies of Example 1 and Comparative Examples 1 to 3 for 210 hours under a high-temperature and humidity condition (85° C. and 85% RH) and the result was illustrated in Table 1.

The rate of increase in surface resistance may be calculated by {(surface resistance of conductive structure body after being maintained for 210 hours−initial surface resistance of conductive structure body)/initial surface resistance of conductive structure body}×100.

TABLE 1

| | Surface resistance ($\Omega$/sq) | | Rate of increase |
| --- | --- | --- | --- |
| | Initial time | After being maintained for 210 hours | in surface resistance (%) |
| Example 1 | 0.52 | 0.50 | −3.85 |
| Comparative Example 1 | 0.87 | 0.88 | 1.15 |
| Comparative Example 2 | 0.24 | 0.32 | 33.3 |
| Comparative Example 3 | 0.37 | 0.39 | 5.41 |

Experimental Example 2

5% NaCl salt water at 35° C. was sprayed to the conductive structure body of Example 1 and Comparative Examples 1 to 5, surface states after 24 hours were evaluated, and the results were illustrated in the following FIGS. 2 to 7.

As described in the result, the conductive structure body according to the exemplary embodiment of the present application includes the aluminum oxynitride layer on the metal layer including aluminum to have high salt water resistance.

EXPLANATION OF REFERENCE NUMERALS

100: Transparent conductive layer
200: Metal layer
210: Patterned metal layer
300: Aluminum oxynitride layer
310: Patterned aluminum oxynitride layer

The invention claimed is:

1. A conductive structure body comprising:
a transparent conductive layer having a thickness of 15 nm or more and 20 nm or less;
a metal layer provided on the transparent conductive layer and including aluminum; and
an aluminum oxynitride layer provided on the metal layer, wherein at a high-temperature and humidity atmosphere of 85° C. and relative humidity of 85%, after 210 hours, a rate of increase in surface resistance of the conductive structure body is 1% or less.

2. The conductive structure body of claim 1, wherein the aluminum oxynitride layer includes aluminum oxynitride represented by AlOxNy, x is more than 0 and 1.5 or less and y is 0.1 or more and 1 or less, x is a content ratio of oxygen atoms in aluminum oxynitride, and y is a content ratio of nitrogen atoms in aluminum oxynitride.

3. The conductive structure body of claim 1, wherein the thickness of the aluminum oxynitride layer is 10 nm or more and 100 nm or less.

4. The conductive structure body of claim 1, wherein the transparent conductive layer includes one or more kinds selected from a group consisting of indium oxide, zinc oxide, indium tin oxide, indium zinc oxide, and a transparent conductive polymer.

5. The conductive structure body of claim 1, wherein the thickness of the metal layer is 0.01 μm or more and 30 μm or less.

6. The conductive structure body of claim 1, wherein the aluminum oxynitride layer is provided on at least one surface of the conductive line.

7. The conductive structure body of claim 1, wherein a line width of the metal pattern layer is 0.1 μm or more and 100 μm or less.

8. A conductive structure body comprising:
a transparent conductive layer;
a metal layer comprising aluminum provided on the transparent conductive layer, wherein the metal layer is a metal pattern layer including one or more conductive lines, wherein a line distance between adjacent conductive lines of the metal pattern layer is 0.1 μm or more and 100 μm or less; and
an aluminum oxynitride layer provided on the metal layer.

9. The conductive structure body of claim 1, wherein surface resistance of the conductive structure body is 0.1 $\Omega$/sq or more and 300 $\Omega$/sq or less.

10. A method for manufacturing the conductive structure body of claim 1, comprising:
preparing a transparent conductive layer;
forming a metal layer including aluminum on the transparent conductive layer; and
forming an aluminum oxynitride layer on the metal layer.

11. The method of claim 10, further comprising:
individually or simultaneously patterning the metal layer and the aluminum oxynitride layer.

12. The method of claim 10, wherein in the patterning, the metal layer and the aluminum oxynitride layer are integrally etched by using an etchant.

13. A display device including the conductive structure body of claim 1.

14. The display device of claim 13, wherein the conductive structure body is a wire portion of a bezel area.

* * * * *